US005597501A

United States Patent [19]

Pollock

[11] Patent Number: 5,597,501
[45] Date of Patent: Jan. 28, 1997

[54] PRECISION CONTROL OF HIGH TEMPERATURE FURNACES USING AN AUXILIARY POWER SUPPLY AND CHARGED PRACTICE CURRENT FLOW

[75] Inventor: George G. Pollock, San Ramon, Calif.

[73] Assignee: United States Department of Energy, Washington, D.C.

[21] Appl. No.: 335,342

[22] Filed: Nov. 3, 1994

[51] Int. Cl.⁶ .................................................. H05B 1/02
[52] U.S. Cl. .......................... 219/494; 219/497; 373/136; 266/78
[58] Field of Search ..................... 219/121.54, 121.57, 219/492, 494, 497, 121.59; 373/18–22, 25, 45, 135, 136; 204/298.06; 266/78, 200

[56] References Cited

U.S. PATENT DOCUMENTS

| | | | |
|---|---|---|---|
| 2,880,483 | 4/1959 | Hanks et al. | 22/57.2 |
| 2,963,530 | 12/1960 | Hanks et al. | 13/31 |
| 3,087,211 | 4/1963 | Howe | 22/57.2 |
| 3,226,223 | 12/1965 | Bussard et al. | 75/10 |
| 3,822,873 | 7/1974 | Pletscher | 266/33 R |
| 3,973,075 | 8/1976 | Borkowski | 359/213 |
| 4,124,199 | 11/1978 | Jones et al. | 266/88 |
| 4,252,626 | 2/1981 | Wright et al. | 204/192 R |
| 4,849,016 | 7/1989 | Worchester et al. | 75/10.26 |
| 4,867,848 | 9/1989 | Cordier et al. | 201/6 |
| 5,178,739 | 1/1993 | Barnes et al. | 204/192.12 |

Primary Examiner—Mark H. Paschall
Attorney, Agent, or Firm—John P. Wooldridge; William C. Daubenspeck; William R. Moser

[57] ABSTRACT

Two power supplies are combined to control a furnace. A main power supply heats the furnace in the traditional manner, while the power from the auxiliary supply is introduced as a current flow through charged particles existing due to ionized gas or thermionic emission. The main power supply provides the bulk heating power and the auxiliary supply provides a precise and fast power source such that the precision of the total power delivered to the furnace is improved.

18 Claims, 2 Drawing Sheets

PRECISION CONTROL OF HIGH TEMPERATURE FURNACES USING AN AUXILIARY POWER SUPPLY AND CHARGED PRACTICE CURRENT FLOW

PRECISION CONTROL OF HIGH TEMPERATURE FURNACES

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to control of high temperature furnaces. More specifically, it relates to the combination of two power supplies to precisely control the temperature of a high temperature furnace.

2. Description of Related Art

High temperature electric furnaces, typically operating in the range of 800 to 2000 degrees Celsius, are used widely in science and industry. One of their common uses is to grow and process the silicon crystals used to make semiconductors. These furnaces have been used to grow materials of interest for laser research. FIG. 1 shows a typical prior art furnace comprising main power supply 2 electrically connected through furnace enclosure 4 to heating element 6 which is located to provide heat to object 8.

In many of the processes, including crystal growth, the quality of the product is strongly affected by the precision with which the furnace temperature can be controlled. Precision is measured in both the dimensions of temperature and time. In many processes, high precision averaged over a long time period is not sufficient. In such processes, the furnace response time is fast and the process is strongly affected by even short term variations in temperature. In the Gradient Freeze method of crystal growth, for example, the location of boundary between the melted feed stock material and the growing crystal is directly affected by the temperature in the furnace. Even a short term variation in furnace temperature can produce a defect in the growing crystal.

Precision control of the furnace temperature requires precise control of the power that drives the furnace. These furnaces typically require tens of kilowatts of electrical power. Power supplies of this capacity are, of economic necessity, somewhat imprecise devices. They are also typically slow to respond to their control inputs, frustrating the use of external instrumentation to improve their quality. At these power levels, power control is almost universally accomplished by control of the raw alternating current (AC) power to the power supply inputs. While such control can be made precise, it cannot be easily made fast at the same time. High precision control of large power supplies has a penalty in quickness of response. At high power levels, it is not practical to have a source of stored energy in the supply that could smooth over transients in the AC prime power. At high power levels, the user is generally forced to share AC mains with other high power users. This can introduce transient power disturbances into the system. The combination of slow control response time in the power supply, coupled with the absence of an energy storage process, means that AC line transients of short duration are passed through the power supply to the load without correction.

Smaller power supplies are radically different in design and commonly have both fast response speed and high precision. If such a supply could be used to add energy to the furnace, its speed and precision could be used to compensate for the imperfections in the main power supply so that the total power delivered would be more precisely controlled. It is generally not possible to combine the outputs of small, fast supplies with that of large, slow supplies. Either series or parallel connections would require that the output stages of the small supply have the power handling capacity of the large supply. A different approach would be to add the contribution of a small, fast supply to that of the large supply in a manner that allowed them to remain electrically separate but summed their powers by independent physical processes in the furnace. The present invention provides such a method.

Further, it is difficult, with the current technology, to make high bandwidth measurements of temperatures in furnaces at high temperatures. In most methods of temperature measurement, the response time of the measurement is dominated by the response time of the temperature measurement probe. In a furnace that had a power control system capable of very quick response, as this invention proposes, it would be necessary to have a means of temperature measurement of equally quick response.

It is desirable to have an apparatus capable of precisely controlling high temperature furnaces. The present invention provides such an article.

SUMMARY OF THE INVENTION

It is an object of the present invention to provide precision control of high temperature furnaces.

It is another object of the present invention to combine the power of two power supplies of greatly differing output capacities in a single furnace.

This invention combines two power supplies to control a furnace. A main power supply heats the furnace in the traditional manner, while the power from the auxiliary supply is introduced as a current flow through charged particles existing due to ionized gas or thermionic emission. The main power supply provides the bulk heating power and the auxiliary supply 10 provides a precise and fast power source such that the precision of the total power delivered to the furnace is improved. Further, this invention comprises a means for high speed measurement of temperature of the process by the method of measuring the amount of current flow in a deliberately induced charged particle current.

DETAILED DESCRIPTION OF THE INVENTION

Figure 1:
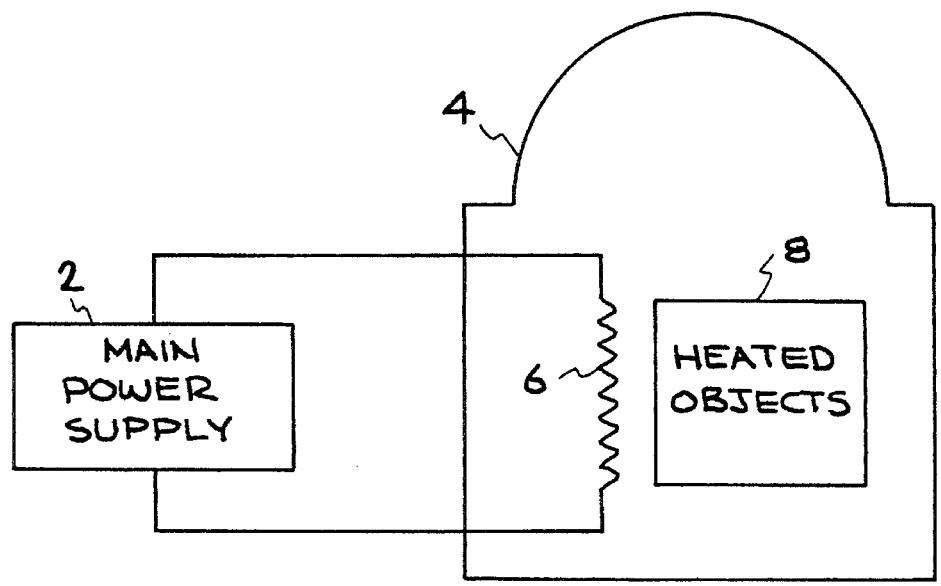
FIG. 1 illustrates a prior art electrical resistance heated furnace.
Figure 2:
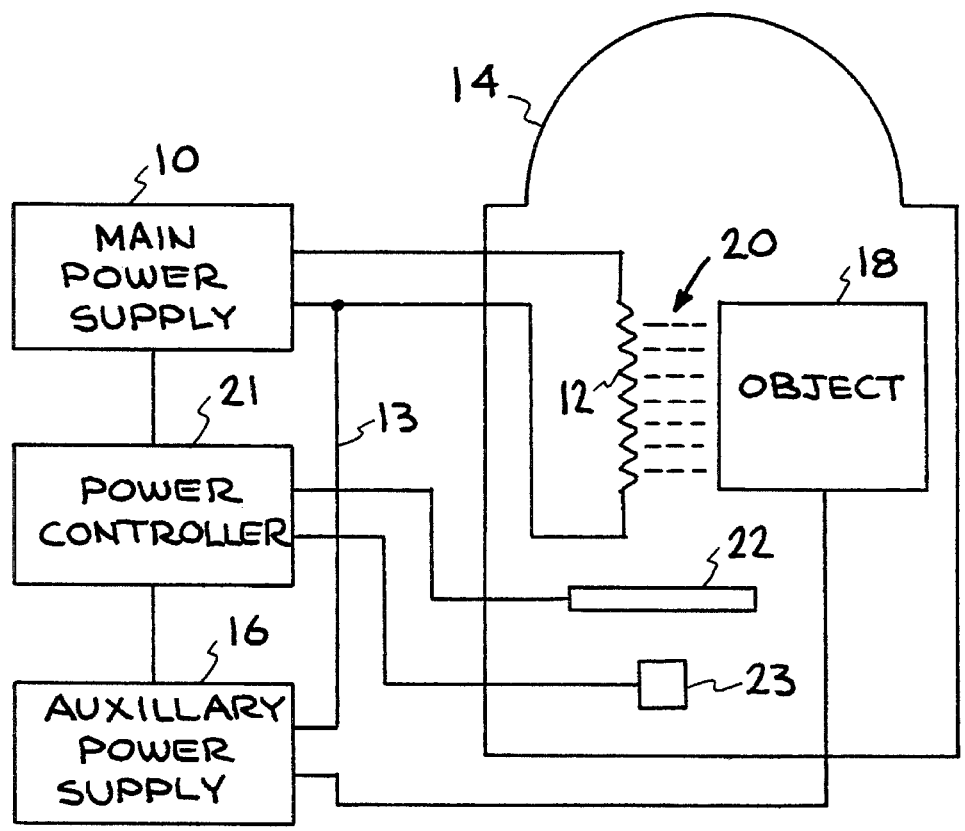
FIG. 2 illustrates an electrical resistance furnace with auxiliary power.

Referring to FIG. 2, an object to be heated 18 is positioned inside furnace enclosure 14. A heating element 12 is located near object 18 and is electrically connected through the furnace enclosure wall to a main power supply 10 which provides the bulk power to the heating element. The object 18 is electrically connected through the furnace enclosure wall to an auxiliary power supply 16, which has one side of its output in common with the main power supply.

Figure 5:
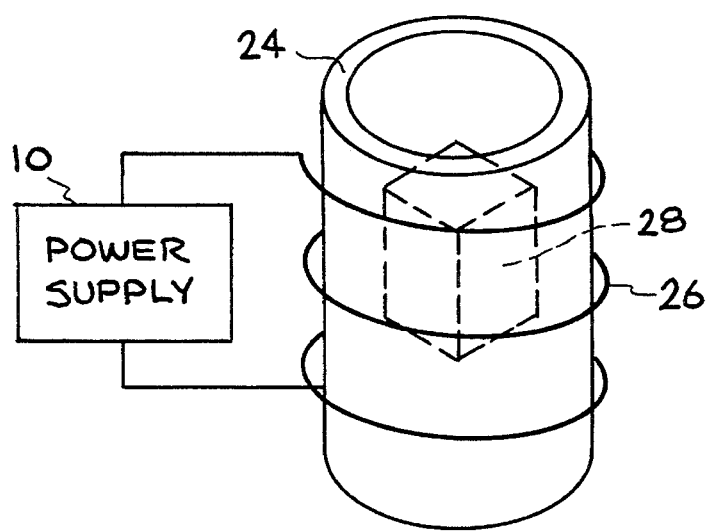
FIG. 5 shows an inductively heated susceptor.

The main power supply 10 provides voltage and current to the heating element 12 which in turn heats up the object 18. Thermionic emissions from the heating element and other hot surfaces within the vacuum furnace produce charged particles 20 between object 18 and the heating element. The auxiliary power supply 16 provides a charged particle current over the charged particles 20 that are between the object 18 and the heating element 12. The main power supply 10 provides the majority of the power for resistive heating element 12. The power may be alternating current (AC) or direct current (DC), provided that the heating element 12 is electrically isolated from the object 18. Heating element 12 may be a resistive element comprising platinum mesh, graphite or another suitable high temperature resistive material. In an inductively heated furnace, the main power supply 10 would be a source of alternating current and would be inductively coupled to susceptor 24 (FIG. 5). An electrical connection between the susceptor 24 and the auxiliary power supply 16 is required in the inductively heated configuration. Auxiliary DC power supply 16 provides precision control of the total power supply by generating charged particle current between susceptor 24 and heating element 12.

Power controller 21 controls the power output of main power supply 10 and auxiliary power supply 16. The bulk temperature of the furnace is measured with temperature probe 22 which may be a thermo-couple. A fast response temperature measurement of the heated object within susceptor 18 is made with an auxiliary temperature sensor 23 which may be an optical pyrometer or thermometer system. Based on these measurements and measurements of the AC line voltage, and other furnace environmental factors, the power controller 21 supplies a controlled set point to the main power supply 10 such that the power output of main power supply 10 is added to the range of the output of the auxiliary supply 16 to span the total power needed to achieve the desired temperature of the heated object. The power controller 21 supplies a fast, high precision set point to the auxiliary power supply 16 to hold the temperature of the heated object at the desired temperature to an accuracy unobtainable by the unassisted main power supply 10.

The object to be heated may be a crystal. When inductive heating is used, the crystal is placed inside a crucible 28 or ampoule 28 which is contained in a susceptor 24 surrounded by an induction coil 26. The coil 26 is electrically connected to an induction heating supply 30. A crucible is an open container usually of some high temperature material such as platinum or iridium. An ampoule is a closed or sealed container employed to prevent contamination of the contents or evaporative loss of the contents. The induction coil may either heat the ampoule or crucible directly (if they are made of electrically conductive material) or may heat the susceptor.

Typically, the susceptor is a cylinder of graphite or some other electrically conductive high temperature material. The induction coil is usually outside the susceptor and the ampoule or crucible is inside. The susceptor is heated inductively and, in turn, heats the ampoule/crucible by radiative heat transfer.

In a resistively heated furnace, the crucible or ampoule is heated directly. Other passive items, such as shields or moderators, may be located between the heating element and the heated object to control the temperature distribution.

Figure 3:
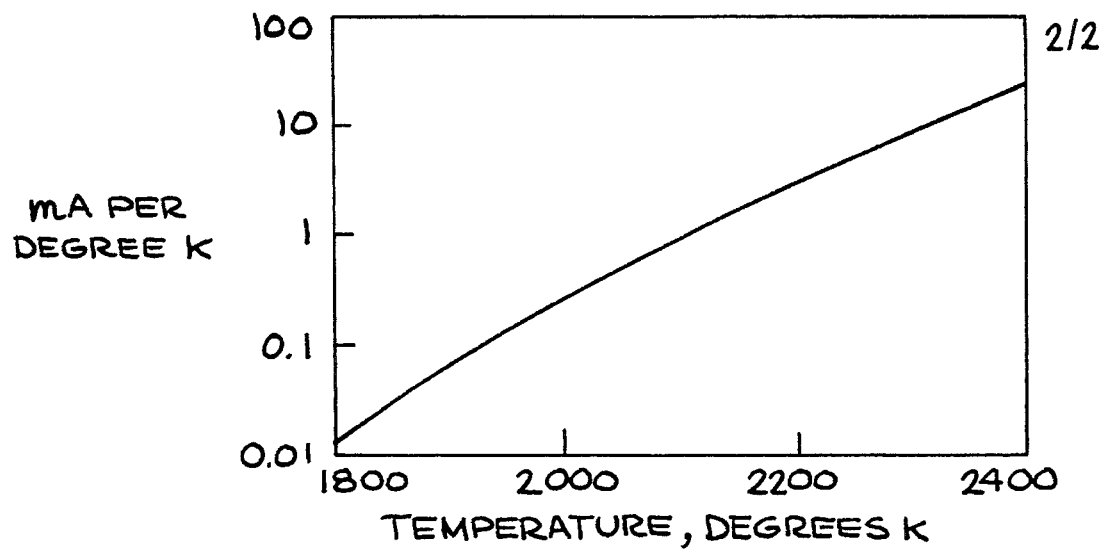
FIG. 3 is a graph of thermionic current sensitivity.
Figure 4:
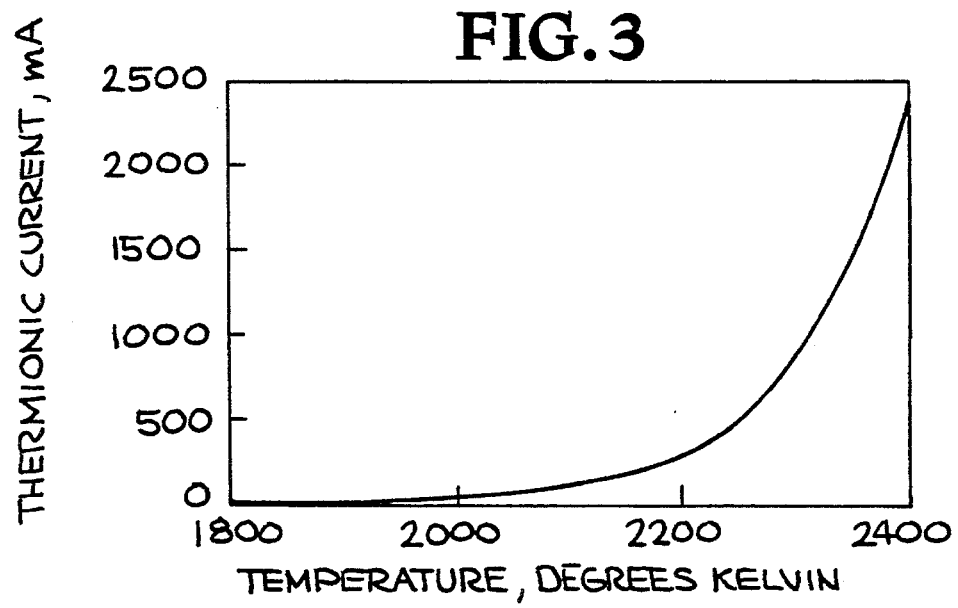
FIG. 4 is a graph of thermionic current versus temperature.

Assuming, e.g., an evacuated furnace providing a current flow of approximately 20 ma at 2000° K; FIG. 3 shows thermionic current sensitivity and FIG. 4 depicts thermionic current versus temperature. Given a desired temperature, the required current can be determined from these graphs. This provides a means for high speed measurement of the temperature of the process by measuring the amount of current flow in a deliberately induced charged particle current.

Changes and modifications in the specifically described embodiments can be carried out without departing from the scope of the invention, which is intended to be limited by the scope of the appended claims.

I claim:

1. An apparatus comprising:

a vacuum furnace enclosure;

a heating element located inside said enclosure;

a main power supply located outside said enclosure, wherein said main power supply is electrically connected through a wall of said enclosure to said heating element, wherein said main power supply provides electrical energy to said heating element, thereby creating thermionic emissions;

an object holder located inside said enclosure, wherein said thermionic emissions from said heating element produce charged particles between said object holder and said heating element; and an auxiliary power supply located outside said enclosure, wherein said auxiliary power supply is electrically and operatively connected through a wall of said enclosure to said object holder, said auxiliary power supply having an output in common with said main power supply, wherein a charged particle current flows through said charged particles between said object holder and said heating element to precisely control the temperature of an object to be heated within said object holder.

2. The apparatus of claim 1, further comprising:

a controller located outside said enclosure and connected to said main power supply and said auxiliary power supply; and a temperature probe located inside said enclosure;

wherein said temperature probe is electrically connected through said enclosure to said controller.

3. The apparatus of claim 1, wherein said object holder is selected from a group consisting of an ampoule and a crucible.

4. The apparatus of claim 3, wherein said crucible comprises material selected from a group consisting of platinum and iridium.

5. The apparatus of claim 2, wherein said temperature probe comprises a thermo-couple.

6. The apparatus of claim 1, wherein said main power supply supplies direct current.

7. The apparatus of claim 1, wherein said main power supply supplies alternating current.

8. The apparatus of claim 7, wherein said heating element comprises a coil electrically connected to said main power supply, said apparatus further comprising a susceptor, wherein said coil is wound around said susceptor, said object holder located within said susceptor.

9. The apparatus of claim 7, further comprising a susceptor, wherein said heating element comprises a coil electrically connected to said main power supply, wherein said coil is wound around said object holder, wherein said auxiliary power supply supplies direct current.

10. The apparatus of claim 1, further comprising a shield between said heating element and said object holder.

11. The apparatus of claim 1, wherein said object holder is electrically conductive.

12. The apparatus of claim 1, wherein said object holder is thermally conductive.

13. The apparatus of claim 1, wherein said heating element comprises a resistive heating element.

14. The apparatus of claim 13, wherein said resistive heating element is selected from a group consisting of platinum mesh and graphite.

15. The apparatus of claim 9, wherein said heating element is inductively coupled to said susceptor.

16. The apparatus of claim 1, wherein said auxiliary power supply supplies direct current.

17. An apparattus comprising:

a vacuum furnace enclosure;

a heating element located inside said enclosure;

a main power supply located outside said enclosure, wherein said main power supply is electrically connected through a wall of said enclosure to said heating element, wherein said main power supply provides electrical energy to said heating element, thereby creating thermionic emissions;

an object holder located inside said enclosure, wherein said thermionic emissions from said heating element produce charged particles between said object holder and said heating element;

an auxiliary power supply located outside said enclosure, wherein said auxiliary power supply is electrically and operatively connected through a wall of said enclosure to said object holder, said auxiliary power supply having an output in common with said main power supply, wherein a charged particle current flows through said charged particles between said object holder and said heating element to precisely control the temperature of an object to be heated within said object holder;

a controller located outside said enclosure and connected to said main power supply and said auxiliary power supply;

a temperature probe located inside said enclosure;

wherein said temperature probe is electrically connected through said enclosure to said controller; and a fast response auxiliary temperature sensor located inside said enclosure, said fast response temperature sensor selected from a group consisting of an optical pyrometer and a thermometer.

18. The apparatus of claim 17, wherein said controller supplies a controlled set point to said main power supply such that the power output of said main power supply is added to the output of said auxiliary power supply to achieve a desired temperature of an object within said susceptor.

* * * * *